(12) United States Patent
Cheng et al.

(10) Patent No.: US 9,254,998 B2
(45) Date of Patent: Feb. 9, 2016

(54) MEMS DEVICE WITH A CAPPING SUBSTRATE

(71) Applicant: Taiwan Semiconductor Manufacturing Company, Ltd., Hsin-Chu (TW)

(72) Inventors: Chun-Wen Cheng, Zhubei (TW); Chia-Huan Chu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 231 days.

(21) Appl. No.: 13/792,617

(22) Filed: Mar. 11, 2013

(65) Prior Publication Data

US 2014/0252508 A1    Sep. 11, 2014

(51) Int. Cl.
*B81B 3/00* (2006.01)
*B81C 1/00* (2006.01)

(52) U.S. Cl.
CPC ........... *B81C 1/00246* (2013.01); *B81B 3/0051* (2013.01); *B81B 2207/015* (2013.01); *B81B 2207/096* (2013.01); *B81C 2203/0118* (2013.01); *B81C 2203/0742* (2013.01); *B81C 2203/0778* (2013.01)

(58) Field of Classification Search
CPC ............ H01L 2924/1461; H01L 21/00; B81B 3/0051

USPC ................ 438/53; 257/417–419; 73/715–731
See application file for complete search history.

(56) References Cited

U.S. PATENT DOCUMENTS

| | | | | |
|---|---|---|---|---|
| 7,381,583 | B1* | 6/2008 | Ebel et al. ........................ | 438/53 |
| 8,183,078 | B2* | 5/2012 | Ollier et al. ..................... | 438/52 |
| 8,433,084 | B2* | 4/2013 | Conti ..................... | B81B 7/0061 381/174 |
| 8,546,188 | B2* | 10/2013 | Liu et al. ........................ | 438/109 |
| 8,716,051 | B2* | 5/2014 | Lin et al. ........................ | 438/51 |
| 8,742,872 | B2* | 6/2014 | Iwasaki ................ | H03H 9/1057 257/415 |
| 8,900,905 | B1* | 12/2014 | Liu ........................... | B81B 7/00 257/254 |
| 9,096,424 | B2* | 8/2015 | Conti ..................... | B81B 7/0061 |
| 2013/0334620 | A1* | 12/2013 | Chu et al. ...................... | 257/415 |

* cited by examiner

*Primary Examiner* — Evan Pert
(74) *Attorney, Agent, or Firm* — Haynes and Boone, LLP

(57) ABSTRACT

An integrated circuit device includes a dielectric layer disposed onto a first substrate, the dielectric layer having a sacrificial cavity formed therein. The circuit also includes a membrane layer formed onto the dielectric layer and suspended over the sacrificial cavity, and a capping substrate bonded to the membrane layer such that a second cavity is formed, the second cavity being connected to the sacrificial cavity though a via formed into the membrane layer.

20 Claims, 6 Drawing Sheets

MEMS DEVICE WITH A CAPPING SUBSTRATE

BACKGROUND

A micro-electromechanical system (MEMS) device is a piece of technology with components on a very small scale. MEMS devices may have components within the micrometer size range and sometimes within the nanometer size range. A typical MEMS device may include processing circuitry as well as mechanical components, such as for various types of sensors. These sensors may be used as part of a Radio Frequency (RF) switch, gyroscope, accelerometer, or motion sensor, responses from which are provided to and processed by the included processing circuitry.

The mechanical components of MEMS devices are often provided in chambers, in which the components are allowed to move. Often there are two chambers connected through one or more vias. One way to form such chambers is to use a sacrificial material. Specifically, a cavity is formed into a particular layer. That cavity is then filled with a sacrificial material. Subsequent layers may then be deposited on top of the sacrificial material. A via is then formed through the subsequent layers to expose the sacrificial material. The sacrificial material can then be released through various chemical processes. While this is an effective way to form chambers, it is desirable to minimize the number of sacrificial layers when fabricating MEMS devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
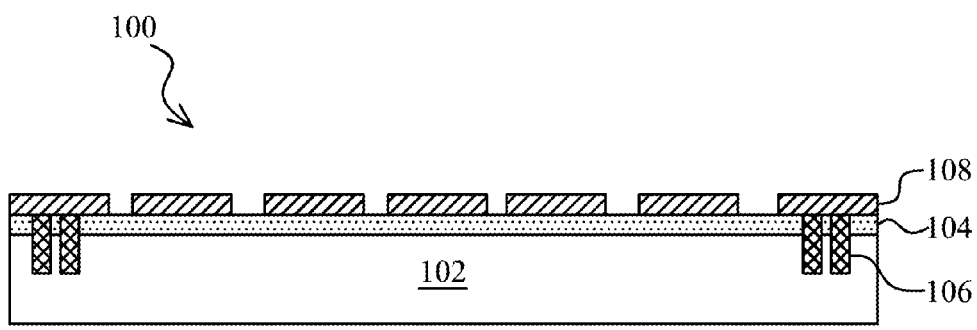
FIGS. 1A-1H are diagrams showing an illustrative process for forming a MEMS device that includes a capping substrate, according to one example of principles described herein.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIGS. 1A-1H are diagrams showing an illustrative process 100 for forming a MEMS device that includes a capping substrate. According to the present example, the MEMS device is built onto a substrate 102. In one example, the substrate 102 is a high resistive substrate. A high resistive substrate may be one that is at least 1000 ohms-cm. In the present example, the substrate 102 also includes a semiconductor material such as silicon.

According to the present example, a dielectric layer 104 is deposited onto the high resistive semiconductor substrate 102. The dielectric layer 104 may be made of an oxide material. The dielectric layer acts as an isolation layer between the semiconductor substrate and components formed on top of the dielectric layer 104.

In this example, a number of thru-silicon vias 106 are formed through the dielectric layer 104 and into the high resistive semiconductor substrate 102. The thru-silicon vias 106 do not extend all the way though the substrate 102. In one example, the edges of the thru-silicon vias 106 can be oxidized through a thermal oxidation process. This coats the inner walls of the vias with a dielectric oxide layer. A metallic or electrically conductive material is then formed into the vias. In one example, the electrically conductive material is tungsten. In some examples, a Chemical-Mechanical Polishing (CMP) process may be performed to smooth out the top of the dielectric layer 104 and prepare it for further processing.

A metal layer 108 is formed onto the dielectric layer 104. The metal layer acts as a bottom electrode layer for a sacrificial cavity to be formed as will be described further below. The bottom electrode metal layer 108 may be formed by depositing a metal material onto the dielectric layer 104. A photomask may then be used to pattern the metal layer appropriately.

Figure 1B:
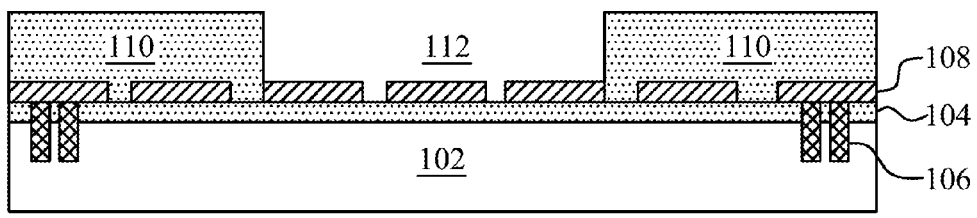

FIG. 1B illustrates the formation of an interlayer dielectric layer 110. The interlayer dielectric layer 110 exists between two electrode layers. The inter-layer dielectric layer 110 may be made of an oxide material. A CMP process may be used to smooth out the inter-layer dielectric layer 110. A mask may then be used to form a pattern for a cavity region 112 within the interlayer dielectric layer 110. An etching process may be used to remove the dielectric layer 110 to expose the underlying bottom electrode metal layer 108 to create the cavity 112.

Figure 1C:
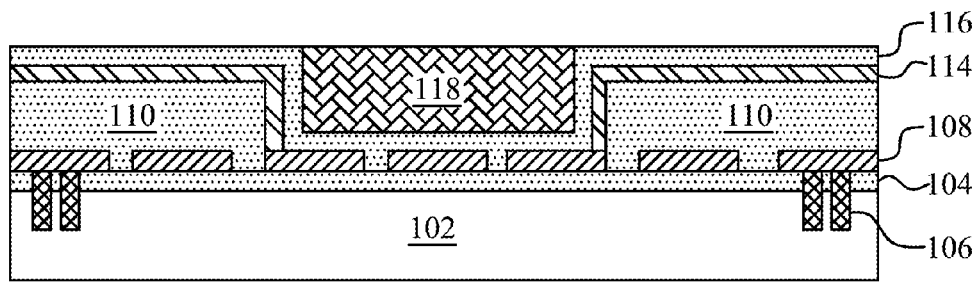

FIG. 1C illustrates the deposition of additional dielectric layers. For example, an oxide layer 114 may be formed on top of the inter-layer dielectric layer 110. In some cases, this oxide layer 114 may be patterned such that oxide bumps (not shown) remain on top of some of the metal contacts of the metal layer 108. Additionally, a thin dielectric material 116 may be deposited on top of the oxide layer 114.

The sacrificial cavity 112 is filled with a sacrificial material 118 such as amorphous silicon (a-Si), a non-crystalline allotropic form of silicon. The sacrificial material 118 is selected so that it can be removed through a dry etching process as will be described further below. After the sacrificial material 118 has been deposited, a CMP process may be used to smooth out the surface.

Figure 1D:
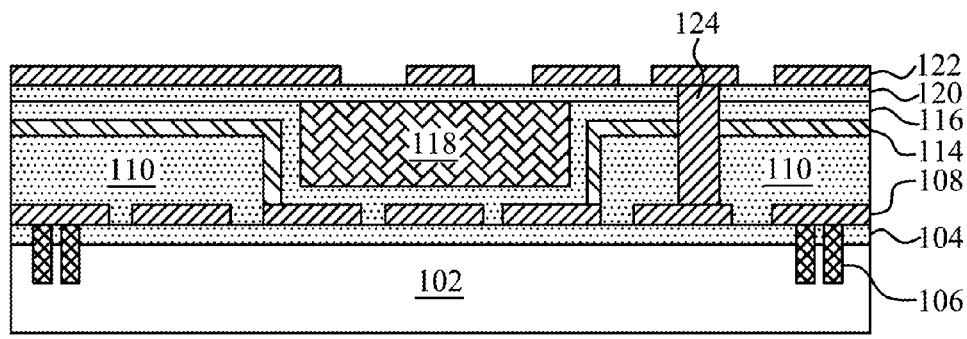

FIG. 1D illustrates the deposition of an additional thin dielectric film 120 on top of the dielectric material 116 and the sacrificial material 118. Both the first thin dielectric layer 116 and the second dielectric layer 120 may be made from the same material. The dielectric layers 116, 120 isolate the lower layers from any additional layers that are later formed.

According to the present example, a via 124 is formed into the deposited layers. Specifically, the via 124 may be formed through the thin dielectric layer 116, 120, the oxide layer 114, the interlayer dielectric layer 110 and stop at the top electrode metal layer 108. A top electrode metal layer 122 may then be formed on top of the thin dielectric layer 120. When depositing the metal material, the via 124 is filled so that the top electrode layer 122 and the bottom electrode layer 108 are electrically connected. While one via 124 is illustrated, it may be the case that multiple vias are used to connect metal components of the top electrode metal layer 122 with metal components of the bottom electrode metal layer 108.

The top electrode metal layer 122 may be formed in a manner similar to that of the bottom electrode metal layer 108. Specifically, a metal or conductive material is deposited onto the previous layer. The metal layer 122 can then be patterned using a mask. An etching process is then used to remove metal from the regions where metal is not intended to be formed. In some examples, a particular metal contact may extend over the sacrificial material 118. This allows metal features to be formed between the sacrificial cavity and a second cavity that will be described in further detail below.

Figure 1E:
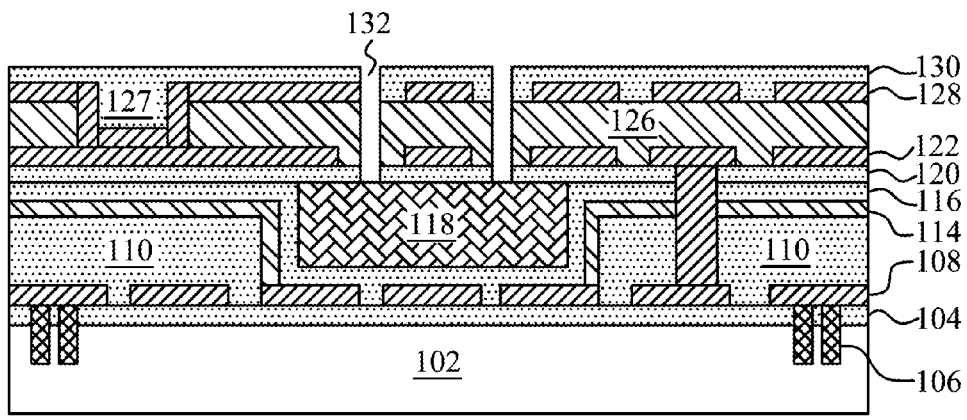

FIG. 1E illustrates the formation of a membrane layer 126. The membrane layer is an additional dielectric layer. It will be referred to as a membrane layer to distinguish it from the first inter-layer dielectric layer 110. Moreover, the membrane layer may be used as an RF switch membrane. The membrane layer 126 provides mechanical strength and rigidity to act as a flexible suspended membrane or beam for a movable structure in the MEMS device. In certain examples, the membrane layer 126 has a thickness T in a range from about 0.5 micrometer to about 5 micrometer. The membrane layer 126 may include a number of vias 127. The vias 127 may be performed through standard photolithographic techniques such as using a photo-mask to expose a photo-resist layer to a light source. The photo-resist layer is then developed away and the remaining regions of photo-resist material are used to define the vias 127. An etching process may then be used to form the vias through the membrane layer 126 down to the underlying top electrode metal layer 122.

According to the present example, a third metal layer 128 is formed onto the membrane layer 126. The third metal layer may connect with the top electrode metal layer 122 where the vias 127 have been formed. The third metal layer 128 may also be formed by depositing the metal material, patterning the metal layer, and then etching away regions where metal is not intended to be formed.

A top dielectric layer 130 is then deposited onto the third metal layer 128. The top dielectric layer may be used for stress balance. The top dielectric 130 layer may be made of an oxide material. In some examples, portions of the top dielectric layer may be removed to expose an underlying metal component. This may be used for various MEMS devices such as an RF switch structure.

After the top dielectric layer 130 has been formed, a number of vias 132 are formed down to the sacrificial material 118. Specifically, the vias 132 are formed through the dielectric layer 130, the membrane layer 126, and the thin dielectric layer 120. The vias 132 may be positioned such that they do not pass through any metal components of either the third metal layer 128 or the top electrode metal layer 122.

Figure 1F:
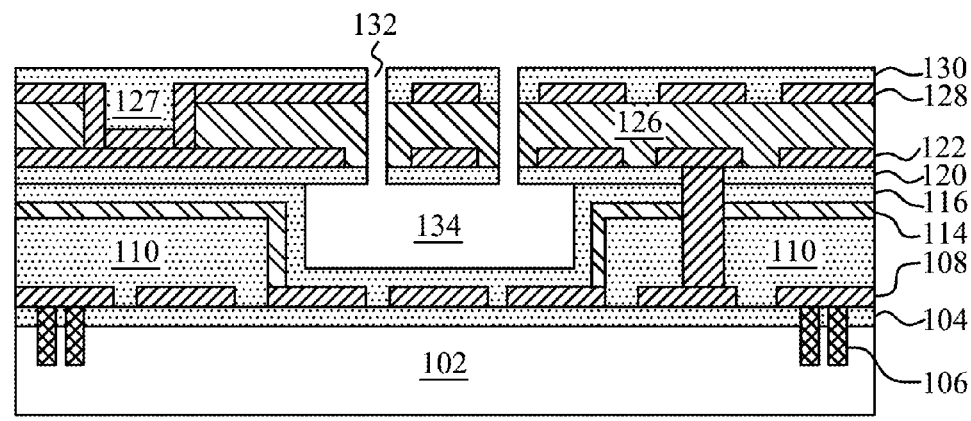

FIG. 1F illustrates the removal of the sacrificial material 118 to form the full sacrificial cavity 134. In one example, the sacrificial material may be etched away using xenon difluoride ($XeF_2$). $XeF_2$ can be used to etch away the amorphous silicon sacrificial material 118 through the vias 132. Other methods to removes the sacrificial material may be used as well. Various dry etching processes may be used. Dry etching involves ion bombardment to remove specific types of material.

The sacrificial material 118 and the material of the thin dielectric layers 116, 120 can be selected so that a particular etchant will remove only the sacrificial material 118 and not the dielectric material. Thus, after the etching process to remove the sacrificial material 118 is complete, the sacrificial cavity 134 will have dielectric layer material on each of the walls. The dielectric material essentially acts as a stop for the etching process that removes the sacrificial material 118.

Figure 1G:
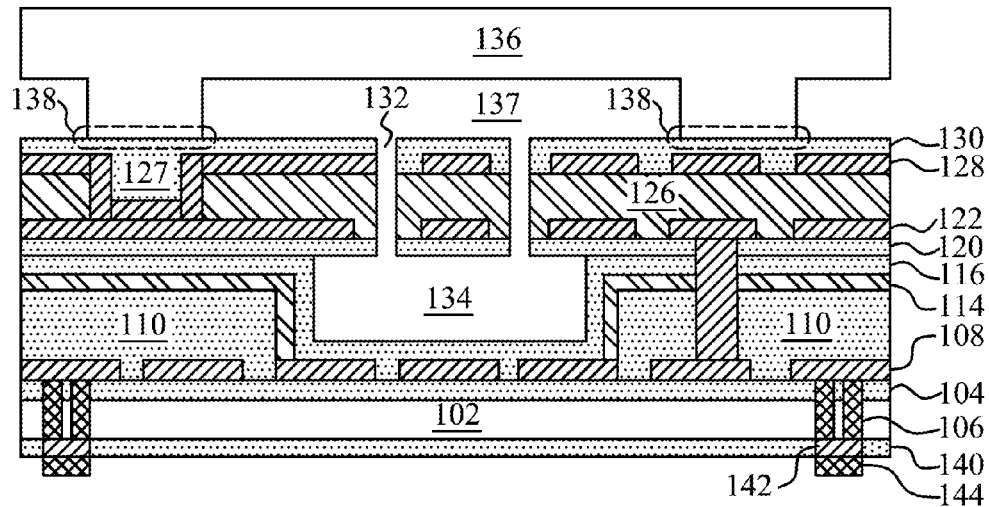

FIG. 1G illustrates the attachment of a capping substrate 136 and preparation of the high resistive substrate 102 for attachment to a CMOS substrate. According to the present example, a capping substrate 136 is used to create a second cavity 137. The capping substrate 136 may be formed separately. Specifically, the capping substrate 136 may be patterned using standard photolithographic techniques so as to have a cavity region formed therein. The capping substrate 136 can then be flipped and bonded to the top dielectric layer 130 such that an enclosed second cavity 137 is formed.

The capping substrate 136 is bonded to the top dielectric layer 130 so as to form a fusion bond 138. A fusion bond 138 involves a thermal annealing process that fuses the capping substrate 136 where it makes contact with the top dielectric layer 130. The bond 138 is such that it seals off the second cavity 137. The second cavity 137 remains connected to the sacrificial cavity 134 through the vias 132. Using processes described herein, various MEMS devices may be formed within the two cavities 132,134. The formation of such devices is not shown. Rather, the figures illustrate the process of forming the substrates and circuitry that support the MEMS devices.

MEMS devices often make use of a CMOS substrate that includes various circuitry used to operate the MEMS device. In some cases, the CMOS substrate is separate from the MEMS substrate. According to the present example, the CMOS substrate is attached to the high resistive substrate. To prepare the high resistive substrate 102 for attachment to the CMOS substrate, the opposite side of the high resistive substrate 102 is ground down to expose the thru-silicon vias 106.

According to the present example, a bottom dielectric layer 140 is deposited onto the bottom of the high resistive substrate 102. This bottom dielectric layer is used to isolate the thru-silicon vias 106. The bottom dielectric layer 140 can then be patterned to expose only the thru-silicon vias 106.

After exposing the thru-silicon vias 106, metal contacts 142 may be formed within the space left by the removed dielectric material. Additionally, a bonding pad 144 may be formed on top of the metal contact 142. The bonding pad is used for a eutectic bond. Eutectic bonding is a method whereby metal is used to bond two substrates together. The bond also allows for an electrical connection between the two substrates.

Figure 1H:
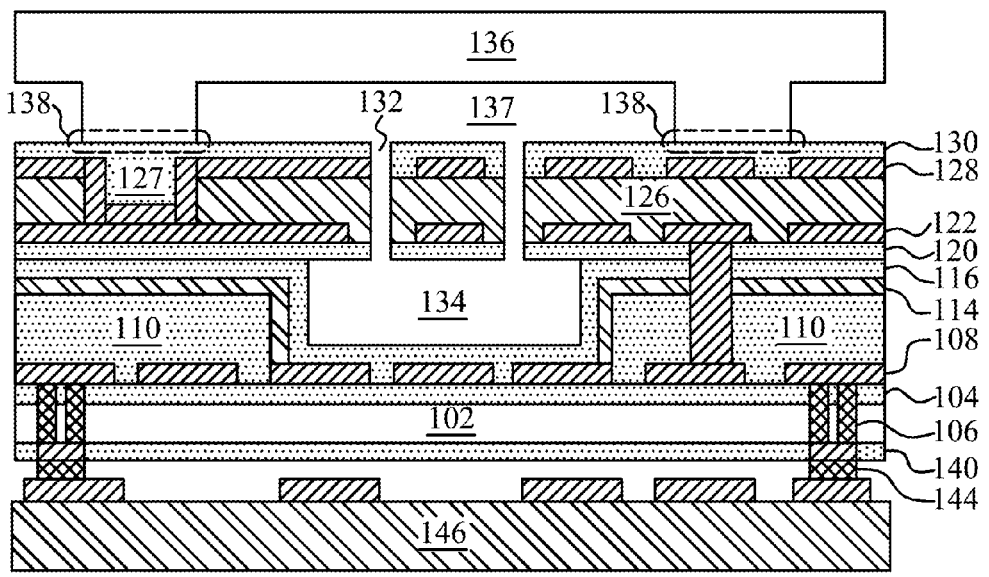

FIG. 1H illustrates the attachment of a CMOS substrate 146. According to the present example, the CMOS substrate 146 may include a number of metal contacts. Some of the metal contacts may be used to connect with the bonding pads 144 on the high resistive substrate 102. The CMOS substrate 146 may include several layers of circuitry (not shown) that can be used to operate a MEMS device within the two cavities 134, 137.

Figure 2:
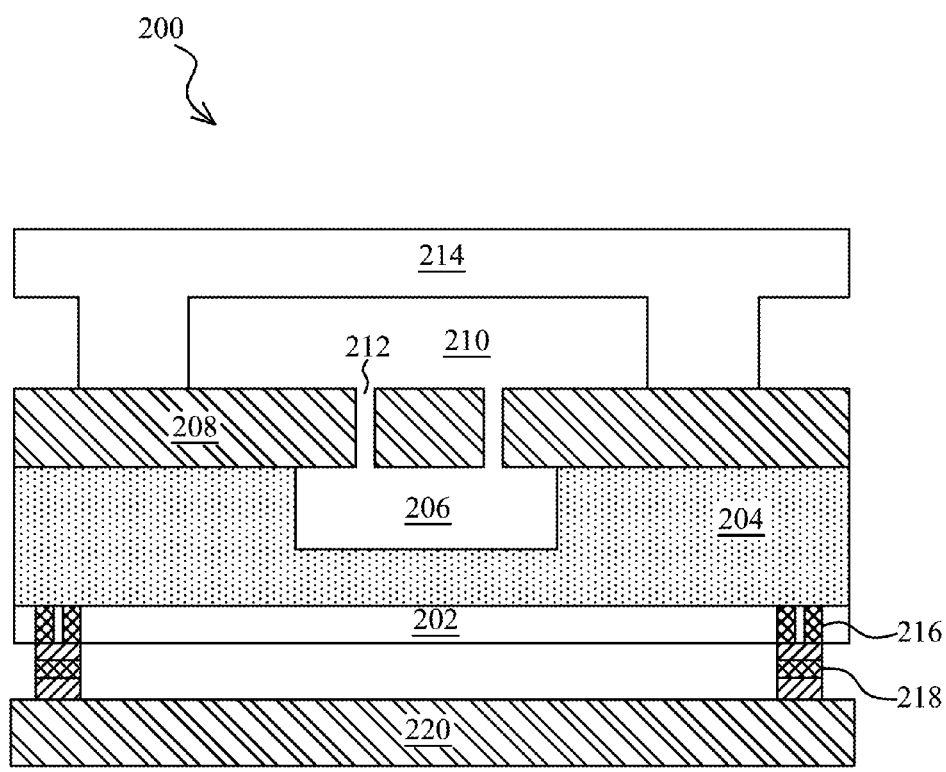
FIG. 2 is a diagram showing an illustrative MEMS device structure that includes a capping substrate, according to one example of principles described herein.

FIG. 2 is a diagram showing an illustrative MEMS device structure that includes a capping substrate. The structure illustrated in FIG. 2 is similar to the structure formed by the process illustrated in FIGS. 1A-1H. However, the structure in FIG. 2 shows only some key layers formed and does not necessarily illustrate all layers that may be formed within a MEMS device embodying principles described herein.

According to certain illustrative examples, the MEMS structure 200 includes a dielectric layer 204 on top of a high resistive substrate 202. The dielectric layer 204 has a sacrificial cavity 206 formed therein. A membrane layer 208 is formed on top of the dielectric layer 204. A capping substrate 214 is connected to an oxide layer of the membrane layer 208. The capping substrate 214 is bonded to the membrane layer 208 so as to form a second cavity 210. The sacrificial cavity 206 is connected to the second cavity 210 through a number of vias 212. The MEMS substrate, which includes the high resistive layer 202, the dielectric layer 204, and the membrane layer 208, is electrically connected to the CMOS substrate 220 through a eutectic bond 218 and some thru-silicon vias 216.

Figure 3:
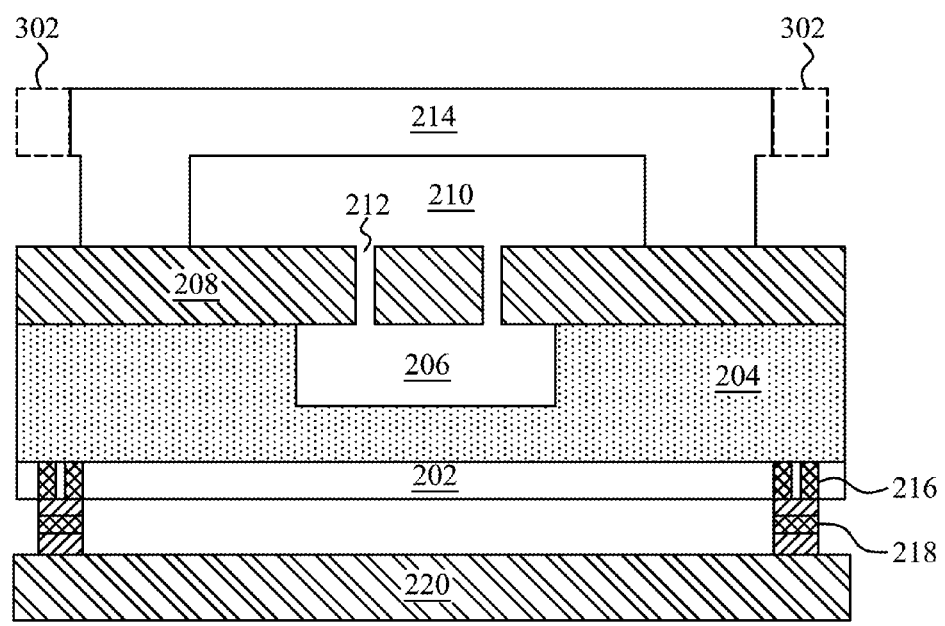
FIG. 3 is a diagram showing an illustrative MEMS device with part of the capping substrate removed, according to one example of principles described herein.

FIG. 3 is a diagram showing an illustrative MEMS device with part of the capping substrate removed. According to certain illustrative examples, when the capping substrate 214 is formed, it may include various structures that are designed for being held by a tool. Specifically, the tool may hold the substrate in place while the fusion bonding is performed to connect the capping substrate 214 to the membrane layer 208.

After the capping substrate 214 has been bonded to the membrane layer 208, the structures that were used to secure the capping substrate 214 may no longer be needed. Thus, an etching process may be performed to remove those parts 302 of the capping substrate 214. In some examples, this removal process may be done through standard photolithographic methods. Alternatively, various grinding processes may be used to remove the undesired parts 302.

Through use of principles described herein, only a single sacrificial layer is used during the fabrication process. Particularly, by using the capping substrate to form the second cavity, a second sacrificial layer is not needed. This allows the overall fabrication process to be achieved more efficiently and cost effectively.

Figure 4:
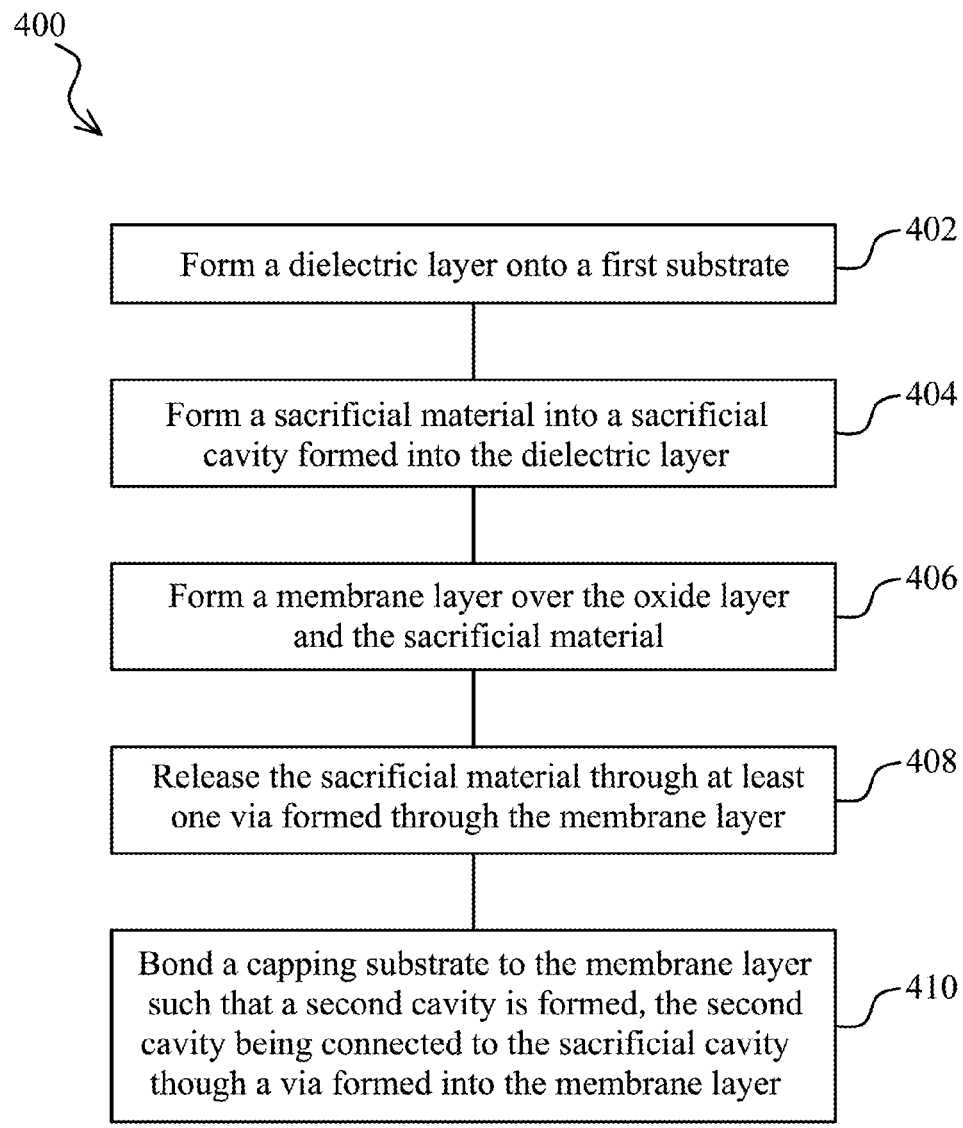
FIG. 4 is a flowchart showing an illustrative method for forming a MEMS device with a capping substrate, according to one example of principles described herein.

FIG. 4 is a flowchart showing an illustrative method for forming a MEMS device with a capping substrate. According to certain illustrative examples, the method includes a step of forming 402 a dielectric layer onto a first substrate. The method further includes a step of forming 404 a sacrificial material into a sacrificial cavity formed into the dielectric layer. The method further includes a step of forming 406 a membrane layer over the dielectric layer and sacrificial material. The method further includes a step of releasing 108 the sacrificial material through at least one via formed through the membrane layer. The method further includes a step of bonding 110a capping substrate to the membrane layer such that a second cavity is formed, the second cavity being connected to the sacrificial cavity though a via formed into the membrane layer.

According to certain illustrative examples, an integrated circuit includes a dielectric layer disposed onto a first substrate, the dielectric layer having a sacrificial cavity formed therein. The integrated circuit further includes a membrane layer formed onto the dielectric layer and suspended over the sacrificial cavity, and a capping substrate bonded to the membrane layer such that a second cavity is formed, the second cavity being connected to the sacrificial cavity though a via formed into the membrane layer.

According to certain illustrative examples, a method for forming an integrated circuit device includes forming a dielectric layer onto a first substrate, forming a sacrificial material into a sacrificial cavity formed into the dielectric layer, forming a membrane layer over the dielectric layer and sacrificial material, releasing the sacrificial material through at least one via formed through the membrane layer, and bonding a capping substrate to the membrane layer such that a second cavity is formed, the second cavity being connected to the sacrificial cavity though a via formed into the membrane layer.

According to certain illustrative examples, an integrated circuit device includes a dielectric layer disposed onto a first substrate, the dielectric layer having a sacrificial cavity formed therein, wherein the first substrate includes a thru-silicon via, a top electrode layer on top of the sacrificial cavity, a bottom electrode layer on bottom of the sacrificial cavity, a membrane layer formed onto the dielectric layer, a capping substrate bonded to the membrane layer such that a second cavity is formed, the second cavity being connected to the sacrificial cavity though a via formed into the membrane layer, and a CMOS substrate connected to an opposite side of the first substrate from the dielectric layer through a eutectic bond and being electrically connected to the first substrate through the thru-silicon via.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:
1. An integrated circuit device comprising:
  a dielectric layer disposed onto a first substrate, the dielectric layer having a sacrificial cavity formed therein;
  a membrane layer formed onto the dielectric layer and suspended over the sacrificial cavity; and a capping substrate bonded to the membrane layer such that a second cavity is formed, the second cavity being connected to the sacrificial cavity though a via formed into the membrane layer.

2. The device of claim 1, wherein the first substrate comprises a thru-silicon via that connects to a metal bonding pad formed on an opposite side of the first substrate from the dielectric layer.

3. The device of claim 2, further comprising a CMOS substrate eutectically bonded to the metal bonding pad.

4. The device of claim 1, further comprising a bottom electrode layer at a bottom of the sacrificial cavity and a top electrode layer at a top of the sacrificial cavity.

5. The device of claim 4, wherein a conductive element of the top electrode layer extends over the sacrificial cavity.

6. The device of claim 1, wherein the first substrate is a high resistive substrate having a resistance of at least 1000 ohm-cm.

7. The device of claim 1, wherein the capping layer is fusion bonded to a thin dielectric layer formed on the membrane layer.

8. The device of claim 1, further comprising a thin dielectric layer on the inner walls of the sacrificial cavity.

9. The device of claim 1, further comprising a suspended portion of the membrane layer between the sacrificial cavity.

10. The device of claim 9, wherein suspended portion comprises a Radio Frequency (RF) switch device.

11. An integrated circuit device comprising:
a dielectric layer disposed onto a first substrate, the dielectric layer having a sacrificial cavity formed therein, wherein the first substrate includes a thru-silicon via;
a top electrode layer on top of the sacrificial cavity;
a bottom electrode layer on bottom of the sacrificial cavity;
a membrane layer formed onto the dielectric layer;
a capping substrate bonded to the membrane layer such that a second cavity is formed, the second cavity being connected to the sacrificial cavity though a via formed into the membrane layer; and
a CMOS substrate connected to an opposite side of the first substrate from the dielectric layer through a eutectic bond and being electrically connected to the first substrate through the thru-silicon via.

12. An integrated circuit device comprising:
a dielectric layer on a first substrate;
a first cavity formed into the dielectric layer;
a membrane layer over the dielectric layer and the first cavity;
at least one opening through the membrane layer; and
a capping substrate that is fusion bonded to the membrane layer such that a second cavity is formed, the second cavity being connected to the first cavity though the at least one opening through the membrane layer.

13. The device of claim 12, further comprising a thru-silicon via in the first substrate beneath the dielectric layer.

14. The device of claim 13, further comprising, a metal pad on an opposite side of the first substrate from the dielectric layer, the metal pad being connected to the thru-silicon via.

15. The device of claim 14, further comprising a Complementary Metal Oxide Semiconductor (CMOS) substrate that is eutectically bonded to the metal pad.

16. The device of claim 12, further comprising, a bottom electrode layer at a bottom of the first cavity and a top electrode layer at a top of the first cavity.

17. The device of claim 16, wherein a conductive element of the top electrode layer extends over the first cavity.

18. The device of claim 12, wherein the first substrate is a high resistive substrate having a resistance of at least 1000 ohm·cm.

19. The device of claim 12, further comprising a thin dielectric layer deposited on the first cavity.

20. The device of claim 12, wherein a portion of the membrane layer is suspended between the first cavity and the second cavity.

* * * * *